United States Patent [19]

Bonn

[11] Patent Number: 5,551,076
[45] Date of Patent: Aug. 27, 1996

[54] CIRCUIT AND METHOD OF SERIES BIASING A SINGLE-ENDED MIXER

[75] Inventor: Fred H. Bonn, Chandler, Ariz.

[73] Assignee: Motorola, Inc., Schaumburg, Ill.

[21] Appl. No.: 300,768

[22] Filed: Sep. 6, 1994

[51] Int. Cl.$^6$ ...................................... H04B 1/28
[52] U.S. Cl. ........................... 455/333; 327/113; 327/408; 327/356
[58] Field of Search .................... 327/552, 559, 327/408, 404, 416, 113, 356; 455/118, 313, 323, 326, 332, 333

[56] References Cited

U.S. PATENT DOCUMENTS

| 4,845,389 | 7/1989 | Pyndiah et al. | 327/113 |
| 5,039,891 | 8/1991 | Wen et al. | 327/113 |
| 5,325,000 | 6/1994 | Birkeland et al. | 455/313 |
| 5,339,459 | 8/1994 | Schiltz et al. | 455/313 |
| 5,376,829 | 12/1994 | Rogers et al. | 327/408 |
| 5,396,132 | 3/1995 | Shiga | 327/113 |

FOREIGN PATENT DOCUMENTS

| 0551857 | 7/1993 | European Pat. Off. | 377/113 |
| 59-19439 | 1/1984 | Japan | 455/333 |
| 5-259745 | 10/1993 | Japan | 327/113 |

OTHER PUBLICATIONS

Elektor (Jul./Aug. 1977), Short Wave Converter p. 51.

*Primary Examiner*—Andrew I. Faile
*Attorney, Agent, or Firm*—Robert D. Atkins

[57] ABSTRACT

A mixer circuit (10) combines a buffered RF signal with the LO signal at the gate of a mixing transistor (20) for providing sum and difference product terms as the IF output signal. An inductor (46) provides a DC signal path between the source of the mixing transistor and the drain of the buffering transistor (14) to share the same operating current and thereby reduce power consumption in the mixer. The DC path inductor provides a high impedance to block the RF signal and LO signal. A bias circuit (26, 28) sets the bias point at the gate of the mixing transistor to a mid-point value between $V_{DD}$ and ground potential. In disable mode, the bias point of the mixing transistor is sufficiently low that the LO signal does not have sufficient power to turn on buffering and mixing transistors that could generate mixing products at the IF output.

19 Claims, 2 Drawing Sheets

CIRCUIT AND METHOD OF SERIES BIASING A SINGLE-ENDED MIXER

BACKGROUND OF THE INVENTION

The present invention relates in general to mixer circuits and, more particularly, to a series biased single-ended mixer.

Mixer circuits are commonly used in radio applications anywhere it is necessary to perform a frequency conversion between a radio frequency (RF) signal and a local oscillator (LO) signal. The mixing process provides an intermediate frequency (IF) output signal as the sum and difference of the mixing product between the RF and LO input signals. In up-mixer applications, the sum of the mixing products provides the higher frequency output signal. In down-mixing applications, the LO signal is subtracted from the RF signal to produce the IF output signal.

Mixing circuits come in a variety of configurations including single-ended, double-balanced and single-balanced type mixers. The single-ended mixer may include a gallium arsenide field effect transistor that combines the RF signal and LO signal at its gate. A buffer amplifier and filtering circuit may be used to isolate the RF signal from the effects of the LO signal. The RF signal and the LO signal as well as their sum and product terms appear on the drain of the mixing transistor. A filtering capacitor is typically coupled from the drain of the mixing transistor to its source in order to isolate the desired sum and difference terms for the IF output signal.

A common problem with signal-ended mixers found in the prior art is the need to individually supply the buffer amplifier and the mixing transistor with sufficient current for operation. For example, the buffering transistor and mixing transistor may each require 2.0 milliamps of operating current from separate power supply taps. It is desirable for example in battery applications such as cellular telephones and digital pagers to reduce the current flow and power consumption through the mixing circuit.

Another common problem with the single-ended prior art mixer occurs during a disable mode when the mixer should not be operating. The mixing transistor is typically an enhancement mode device with its gate referenced to ground potential. The LO signal may have sufficient power to enable the operation of the mixing transistor. Therefore, the prior art mixer typically uses a switching circuit in the LO signal path to block the LO signal from the gate of the mixing transistor during disable periods to ensure that the device does not function.

Hence, a need exists for a mixing circuit that operates with low power consumption while eliminating the switching circuit in the LO signal path.

DETAILED DESCRIPTION OF THE PREFERRED EMBODIMENT

Figure 1:
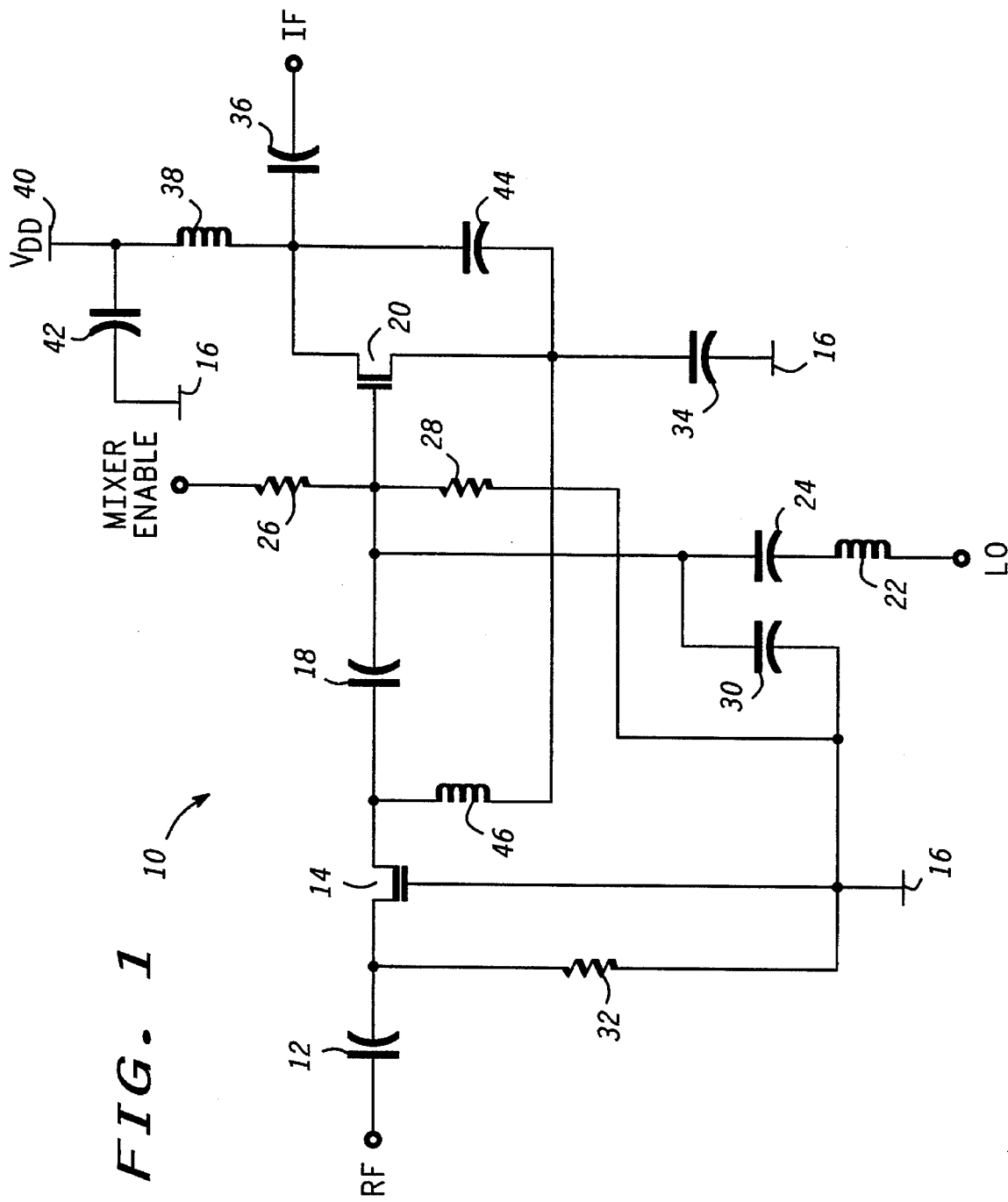
FIG. 1 is schematic diagram illustrating a single-ended mixing circuit.

Referring to FIG. 1, a single-ended mixer circuit 10 is shown for combining a radio frequency (RF) signal with a local oscillator (LO) signal and providing an intermediate frequency (IF) output signal. The RF signal operating at 2.4 giga-hertz (GHz) processes through buffering transistor 14 and combines with the 2.075 GHz LO signal at the gate of mixing transistor 20 for providing sum and difference product terms for the IF output signal. The IF output signal operates at 325 MHz.

The RF signal is applied through DC blocking capacitor 12 to the source of field effect transistor 14 that operates as a common gate buffer amplifier. Transistor 14 is a gallium arsenide depletion mode device. Capacitor 12 is selected at 10.0 picofarads (pf). The gate of transistor 14 is coupled to power supply conductor 16 operating at ground potential. The drain of transistor 14 is coupled through capacitor 18 to the gate of field effect transistor 20. A local oscillator (LO) signal is applied through serially coupled inductor 22 and capacitor 24 to the gate of mixing transistor 20. Transistor 20 is a gallium arsenide enhancement mode device. Inductor 22 is selected at 10.0 nano-henrys (nH) while capacitor 24 is 10.0 pf. Inductor 22 and capacitors 24 and 30 operate as an impedance transformer for converting the high impedance at the gate of transistor 20 to a low impedance, typical 50.0 ohms, at the LO input terminal.

The gate of transistor 20 is biased through resistors 26 and 28 coupled between a MIXER ENABLE signal and power supply conductor 16. Resistors 26 and 28 are selected at 30K ohms each. A capacitor 30 is selected at 0.2 pf and coupled between the gate of transistor 20 and power supply conductor 16. Resistor 32 is coupled between the source of transistor 14 and power supply conductor 16. Resistor 32 is selected at 190.0 ohms to set the current through the common gate buffer amplifier 14o The source of transistor 20 is coupled through a 360.0 pf capacitor 34 to power supply conductor 16. The drain of transistor 20 provides the IF output signal through a DC blocking capacitor 36 that is selected at 100.0 pf. The drain of transistor 20 is further coupled through inductor 38 to power supply conductor 40 operating at a positive power supply potential $V_{DD}$ such as 3.0 volts. Inductor 38 is selected at 8.2 nH. Capacitor 42 is coupled between the power supply conductor 40 and power supply conductor 16 for decoupling the positive power supply potential. Capacitor 42 is selected at 100.0 pf. Capacitor 44 is selected at 15.83 pf and coupled between the drain of transistor 20 and its source.

As part of the present invention, inductor 46 is coupled between the source of transistor 20 and the drain of transistor 14. Inductor 46 is selected at 10.0 nH for providing series biasing in the form of a DC signal path between the source of transistor 20 and the drain of transistor 14. The DC signal path goes from power supply conductor 40 through inductor 38 and the conduction path of transistor 20 and further through inductor 46 and the conduction path of transistor 14. Inductor 46 thus allows transistors 14 and 20 to share the same operating current and thereby reduce the necessary current to supply both. Inductor 46 also serves as an IF filter between the gate and source of transistor 20.

In contrast with the prior art where the buffering transistor and mixing transistor typically each require 2.0 milliamps of operating current from separate power supply taps, the present invention routes the same 2.0 milliamp operating current from the conduction path of transistor 20 through the DC signal path of inductor 46 to the conduction path of transistor 14. By reusing the supply current from transistor 20 to operate transistor 14, the present invention reduces power consumption by avoiding the separate supply current to transistor 14 from the positive power supply conductor as is common in the prior art. Inductor 46 also provides a high impedance between the drain of transistor 14 and the source of transistor 20 to block the RF signal and LO signal to the source of transistor 20. In another embodiment (not shown), a resistor may provide the DC signal path between the source of transistor 20 and the drain of transistor 14.

Mixer circuit 10 is enabled with the MIXER ENABLE signal operating at power supply potential $V_{DD}$ to set the bias point at the gate of transistor 20 to a mid-point value between $V_{DD}$ and ground potential as determined by resistor dividers 26–28. Mixer circuit 10 is disabled by setting the MIXER ENABLE signal to a value near ground potential to reduce the bias point of transistor 20 also near ground potential. In disable mode, the bias point of transistor 20 is sufficiently low that the LO signal does not have sufficient power to turn on transistors 14 and 20 and generate any mixing products at the IF output. Hence, mixer circuit 10 does not require a switching circuit in the LO signal path.

Figure 2:
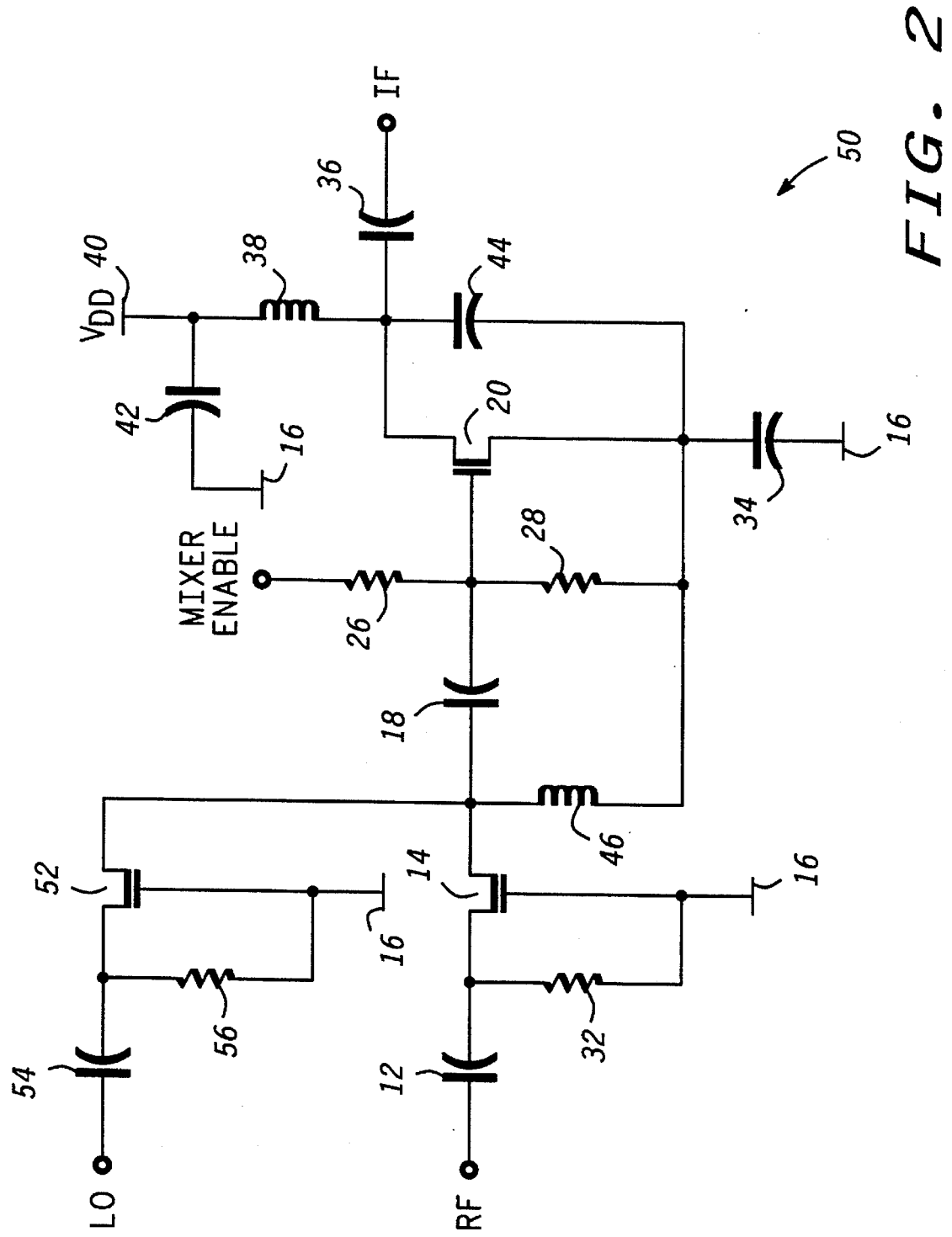
FIG. 2 is an alternate embodiment of the mixing circuit of FIG. 1.

Turning to FIG. 2, an alternate embodiment of the mixer circuit is shown with components having a similar function given the same reference numbers used in FIG. 1. Mixer circuit 50 includes a buffer transistor 52 that receives the LO signal through capacitor 54 at its source. Resistor 56 is coupled between the source of transistor 52 and its gate that is further coupled to power supply conductor 16. The drain of transistor 52 is coupled to the drain of transistor 14 for mixing with the RF signal.

The operation of mixer circuit 50 follows the description given for FIG. 1. Inductor 46 provides the DC signal path between the source of transistor 20 and the drain of transistor 14 to allow the transistors to share the same operating current as described for FIG. 1. Transistor 52 and capacitor 54 and resistor 56 provide the impedance matching function for the LO signal. Resistor 28 is coupled to the source of transistor 20 for referencing the gate of transistor 20 to its source.

By now it should be appreciated that the present invention provides a mixing transistor that combines a buffered RF signal with an LO signal. An inductor provides a DC signal path between the source of the mixing transistor and the drain of the buffering transistor. The series biasing allows the buffering transistor and mixing transistor to share the same operating current and thereby reduce power consumption in the mixer. The DC signal path inductor also provides a high impedance between the drain of buffer transistor and the source of mixing transistor to block the RF signal and LO signal. A resistor divider network sets the bias point at the gate of the mixing transistor to a mid-point value between $V_{DD}$ and ground potential. In disable mode, the bias point of the mixing transistor is sufficiently low that the LO signal does not have sufficient power to turn on buffering and mixing transistors that could generate mixing products at the IF output.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A mixer circuit, comprising:

a first transistor having a gate, a drain and a source, said source being coupled for receiving an RF signal, said gate being coupled to a first power supply conductor;

a second transistor having a gate, a drain and a source, said gate being coupled to said drain of said first transistors said gate being further coupled for receiving an LO signal, said source being coupled to said first power supply conductor, said drain providing an IF output signal; and circuit means coupled between said source of said second transistor and said drain of said first transistor for providing a DC signal path between said source of said second transistor and said drain of said first transistor to allow said first and second transistors to share operating current.

2. The mixer circuit of claim 1 wherein said circuit means includes a first inductor coupled between said source of said second transistor and said drain of said first transistor.

3. The mixer circuit of claim 2 further including a first capacitor coupled between said source of said second transistor and said first power supply conductor.

4. The mixer circuit of claim 3 further including:

a first resistor coupled between an enable input and said gate of said second transistor; and a second resistor coupled between said gate of said second transistor and said first power supply conductor.

5. The mixer circuit of claim 4 further including a second capacitor coupled between said drain of said second transistor and said source of said second transistor.

6. The mixer circuit of claim 5 further including a third resistor coupled between said source of said first transistor and said gate of said first transistor.

7. The mixer circuit of claim 6 further including:

a third capacitor;

a second inductor serially coupled with said third capacitor between said LO signal and said gate of said second transistor; and a fourth capacitor coupled between said gate of said second transistor and said first power supply conductor.

8. The mixer circuit of claim 7 further including:

a third inductor coupled between a second power supply conductor and said drain of said second transistor; and a fifth capacitor coupled between said first power supply conductor and said second power supply conductor.

9. The mixer circuit of claim 8 further including a sixth capacitor coupled between said drain of said first transistor and said gate of said second transistor.

10. A method of mixing an RF signal with an LO signal, comprising the steps of:

buffering the RF signal through a first transistor for providing a buffered RF signal;

mixing said buffered RF signal with the LO signal in a second transistor for providing an IF output signal; and providing a DC signal path between a conduction path of said first transistor and a conduction path of said second transistor to allow said first and second transistors to share operating current.

11. The method of claim 10 further comprising the step of blocking said buffered RF signal and the LO signal through said DC signal path.

12. A mixer circuit, comprising:

a first transistor having a gate, a drain and a source, said source being coupled for receiving an RF signal, said gate being coupled to a first power supply conductor;

a second transistor having a gate, a drain and a source, said gate being coupled to said drain of said first transistor, said gate being further coupled for receiving an LO signal, said source being coupled to said first power supply conductor, said drain providing an IF output signal; and a first inductor coupled between said source of said second transistor and said drain of said first transistor for providing a DC signal path between said source of said second transistor and said drain of said first transistor to allow said first and second transistors to share operating current.

13. The mixer circuit of claim 12 further including a first capacitor coupled between said source of said second transistor and said first power supply conductor.

14. The mixer circuit of claim 13 further including:
   a first resistor coupled between an enable input and said gate of said second transistor; and
   a second resistor coupled between said gate of said second transistor and said source of said second transistor.

15. The mixer circuit of claim 14 further including a second capacitor coupled between said drain of said second transistor and said source of said second transistor.

16. The mixer circuit of claim 15 further including a third resistor coupled between said source of said first transistor and said first power supply conductor.

17. The mixer circuit of claim 16 further including:
   a third transistor having a gate, a drain and a source, said gate being coupled to said first power supply conductor, said drain being coupled to said drain of said first transistor;
   a third capacitor coupled between said LO signal and said source of said third transistor; and
   a fourth resistor coupled between said source of said third transistor and said gate of said third transistor.

18. The mixer circuit of claim 17 further including:
   a second inductor coupled between a second power supply conductor and said drain of said second transistor; and
   a fourth capacitor coupled between said first power supply conductor and said second power supply conductor.

19. The mixer circuit of claim 18 further including a fifth capacitor coupled between said drain of said first transistor and said gate of said second transistor.

* * * * *